United States Patent [19]

D'Antonio

[11] Patent Number: 4,502,146
[45] Date of Patent: Feb. 26, 1985

[54] ADJUSTMENT OF ELECTRONIC SKI BINDING CIRCUITRY

[76] Inventor: Nicholas F. D'Antonio, 7695 Admiral Dr., Liverpool, N.Y. 13088

[21] Appl. No.: 352,385

[22] Filed: Feb. 25, 1982

[51] Int. Cl.³ .................... H03K 17/945; H03K 17/95
[52] U.S. Cl. ....................................... 377/2; 280/612; 280/613; 307/308; 307/116
[58] Field of Search .................. 368/187; 335/205; 280/611, 612, 613; 307/308, 309, 116, 119; 340/712, 365; 377/2

[56] References Cited

U.S. PATENT DOCUMENTS

| | | | |
|---|---|---|---|
| 3,892,980 | 7/1975 | Anderson | 307/116 |
| 4,016,428 | 5/1977 | Gutterman | 307/116 |
| 4,103,483 | 8/1978 | Riley | 368/187 |
| 4,112,317 | 9/1978 | Everswick | 307/308 |
| 4,156,820 | 5/1979 | Fukuda et al. | 307/309 |
| 4,211,959 | 7/1980 | Deavenport et al. | 307/308 |

Primary Examiner—John S. Heyman
Attorney, Agent, or Firm—Woodling, Krost, Rust and Hochberg

[57] ABSTRACT

A means for adjusting an electrical value within inaccessible electrical circuitry is disclosed including a proximity stimulus means acting upon and within the vicinity of a proximity stimulus response means to produce a response which is converted into an electrical signal by a transducing means. The number of electrical signals produced are accumulated and placed into the appropriate electronic form to adjust the electrical value. The magnitude of the adjustable electrical value and its adjustment may be monitored on an optional monitoring means.

24 Claims, 6 Drawing Figures

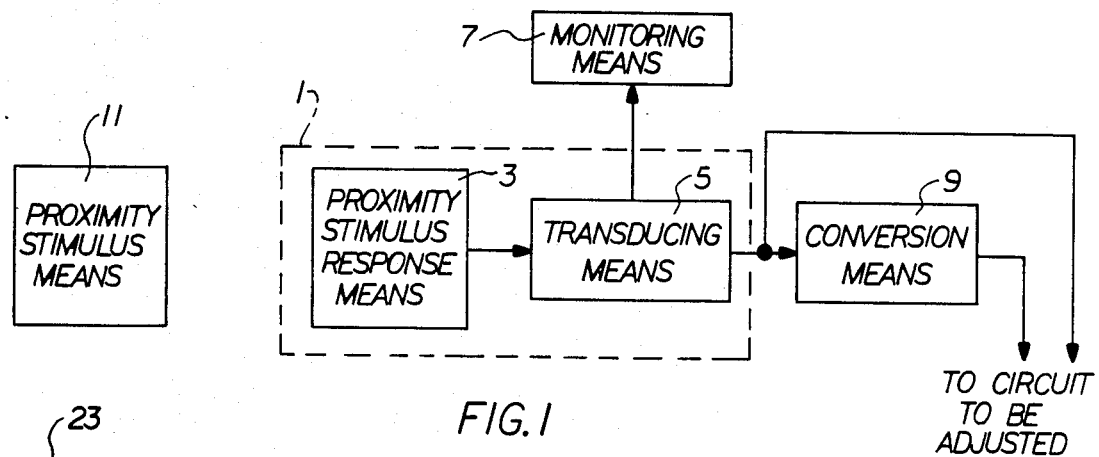
FIG. 1
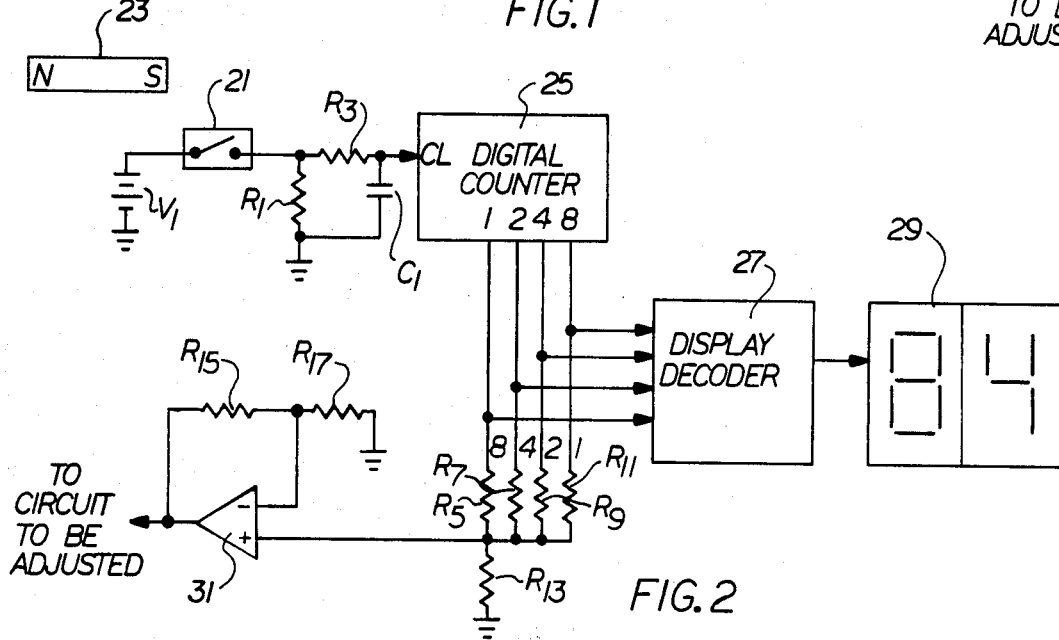
FIG. 2
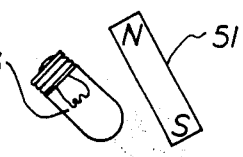
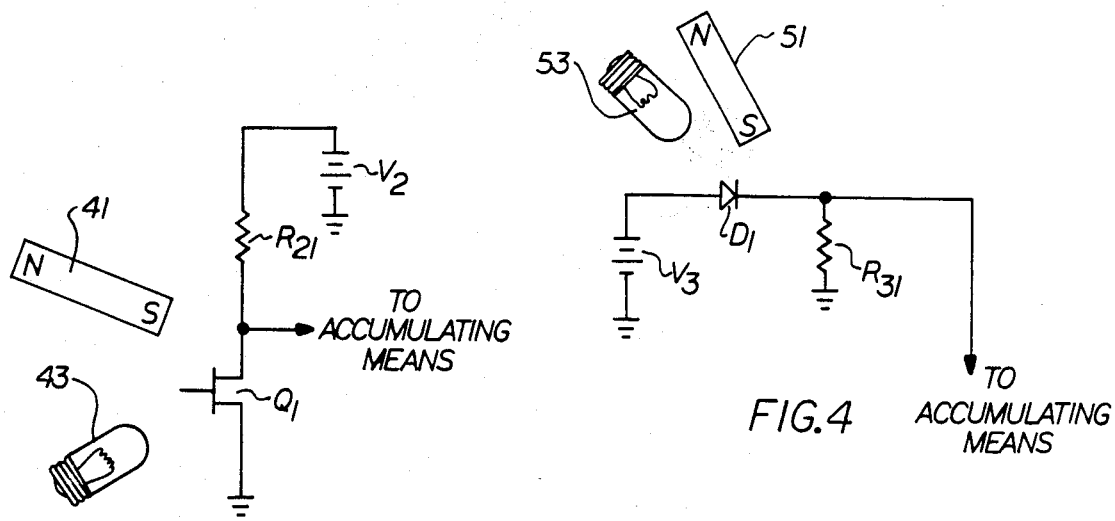
FIG. 3
FIG. 4

ADJUSTMENT OF ELECTRONIC SKI BINDING CIRCUITRY

BACKGROUND OF THE INVENTION

As a result of technological advances in the high density integration of solid state circuits and the economical production of sophisticated microprocessors, microcircuits are being employed in an increasing variety of applications. Electronic circuitry is being added to consumer goods to perform functions not previously available and to complement or improve existing functions. Many of the new applications involve hostile environments where mechanical shock and vibration, wide temperatures ranges, foreign matter and other potential environmental detriments to reliable circuit operation and adjustment may be encountered.

An example of a harsh environment in which microcircuits may be applied include applications to sporting goods. A particular example is the use of electronic signal evaluation, decision-making and release command circuitry in a safety ski binding. Such an electronic safety ski binding is described in U.S. Pat. No. 4,291,894 of which I am a patentee. The electronic safety ski binding described there includes a mechanical portion which in its locked condition firmly grasps a skier's boot and in its released condition permits the ski boot to separate from the binding. During skiing, the released condition is ideally achieved when forces created by skiing threaten the safety or well-being of the skier. The function of the mechanical portion of the safety ski binding is complemented, as described in the patent, by electronic circuitry which senses the skiing forces, continuously evaluates them to determine if the skier is endangered and commands the mechanical portion of the binding to release, i.e. to switch from its locked to released condition, when a situation dangerous to the skier is encountered. As disclosed in the patent, it is desirable to adjust the electronic circuitry to make a decision as to the existence or absence of a potential for injury, taking into account the skill of the skier using the binding and/or other conditions, col. 9, ll. 3-17 and col. 16, ll, 15-31.

In my U.S. Pat. No. 4,309,760, other electronic systems suitable for processing electrical signals related to skiing forces are disclosed. One embodiment of the circuitry described there includes an ability to adjust an electrical threshold which affects the force at which a binding release takes place. For examples, see col. 5, l. 54 to col. 7, l. 13 and col. 10, ll. 28-51.

Ski bindings, and any electronic circuitry associated with them, are subjected to wide temperature swings from storage at room temperature and above to temperatures well below freezing on the slopes. Turns, jumps and acrobatics on skis jar and vibrate the bindings and associated circuitry. Sprays of snow, water, ice, salt, and other foreign matter foul and obscure mechanical parts, penetrate seals and closures of compartments containing electronic circuitry threatening adjustable electro-mechanical components of the circuitry.

Accordingly, it is desired to provide a high degree of environmental isolation from these hostile influences for electronic circuitry adapted for use with or in sporting goods, and particularly in ski bindings. The environmental isolation must be achieved without sacrificing the ability to tune or adjust the circuitry so that different desired responses can be obtained from the same circuitry when used by different persons or used under different conditions.

SUMMARY OF THE INVENTION

The present invention solves the problem of isolation of electronic circuitry from hostile environmental factors by making possible the adjustment of components in circuitry totally encapsulated within an inert material. The ability to adjust various component values of the encapsulated circuitry is achieved by providing as part of the circuitry proximity adjustment means responsive to proximity stimuli. Circuitry tuning or adjustments can then be made by subjecting the proximity adjustment means to the appropriate proximity stimulus which actuates a proximity stimulus response means within the actuation means, without physically invading the encapsulation. Examples of such proximity stimuli are magnetic fields, electromagnetic radiation, such as visible or invisible light, and controlled mechanical blows. Proximity stimulus response means may include, for example, reed switches, Hall Effect devices, phototransistors and piezoelectric devices. The proximity adjustment means may also include a transducing means for converting the output of the proximity stimulus response means into an electrical signal used to adjust a stored reference value or an effective value of an electrical component, such as resistance. The transducing means may include a voltage source and electrical filtering means so that electrical pulses are produced in response to the output of the proximity stimulus response means.

Adjustments of values within circuitry may be monitored on a monitoring means to ensure the variable value is adjusted to the desired magnitude. Conversion means are provided, where necessary, to convert digitally entered adjustment information to an analog form for convenient interface with encapsulated circuitry of either type.

BRIEF DESCRIPTION OF THE DRAWINGS

FIG. 1 is a schematic block diagram of the invention.

FIG. 2 is a schematic diagram electrical circuitry according to an embodiment of the invention.

FIG. 3 is a schematic diagram of an alternative embodiment of a proximity stimulus response means according to the invention.

FIG. 4 is a schematic diagram of an alternative embodiment of a proximity stimulus response means according to the invention.

DETAILED DESCRIPTION OF PREFERRED EMBODIMENTS

Figure 5:
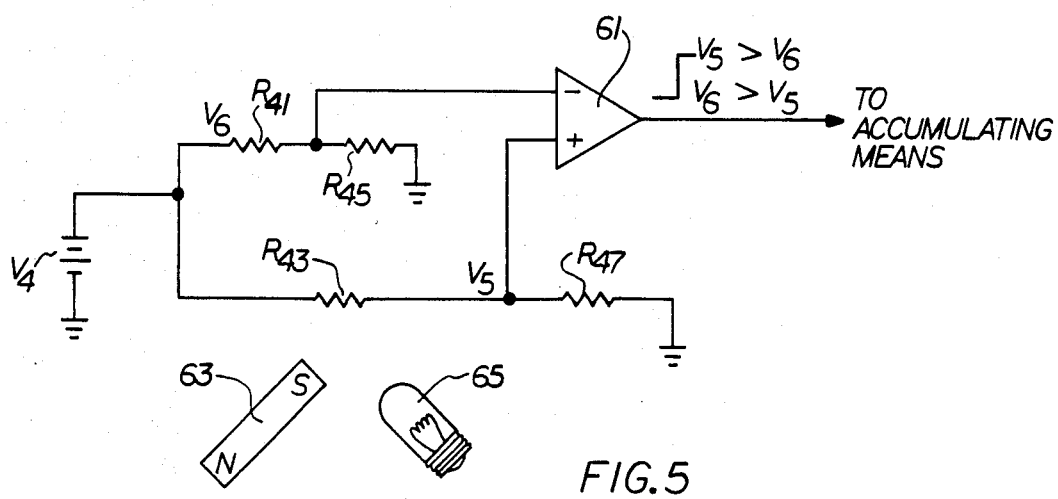
FIG. 5 is a schematic diagram of an alternative embodiment of a proximity stimulus response means according to the invention.

It is well known in the electronic circuitry packaging art that electronic components and entire circuits can be encapsulated within an inert material. The inert material can be formed within a metallic container if desired. In general, electrical leads protrude from the encapsulation for furnishing power of signals to the circuitry or for conducting output signals from it. The encapsulating material may be rigid such as is conventional, for example, with discrete devices such as transistors in TO series metal containers, in plastic encapsulated discrete transistors and many dual-in-line integrated circuit packages. The encapsulation may include vitreous packages such as those within which microprocessors are commonly hermetrically sealed. Or the encapsulating material may be resilient, such as a silicone rubber.

Encapsulation has the advantages of isolating circuitry from physical intrusion by foreign matter which may be deleterious to circuit operation.

In general, the encapsulating material is applied to the circuit as a liquid with a sufficiently low viscosity to flow into and fill all voids and to envelope intimately all circuitry components. The cleanliness of the new circuit and of the virgin encapsulating material cooperate to form reliable bonds between the encapsulating material and circuitry which are impervious to foreign matter. It is preferred that the adjustment circuitry described here be encapsulated in such a material along with the circuitry which is to be adjusted.

Where entire circuits are encapsulated, however, it is impossible to make traditional, mechanical adjustments of circuit components and thereby of electrical values. For example, variable transformers, potentiometers and variable capacitors are normally adjusted by mechanically turning one moveable element (e.g. a coil, a movable wiping contact, a capacitor plate) relative to another stationary element (e.g., a coil, a sheet resistance, a capacitor plate). The protrusion of a mechanically moveable element through encapsulating material defeats its environmental isolation purpose since the sliding surfaces may admit foreign matter. Likewise, maintaining the adjusting elements, such as potentiometers, external to the encapsulation leaves them susceptible to environmental factors destroying the purpose of the encapsulation. Accordingly, in the present invention, a means for adjusting circuitry, i.e., electrical values, of an encapsulated or otherwise inaccessible circuit is described which avoids physical intrusion into the encapsulated or otherwise inaccessible circuitry and the presence of sliding surfaces to variable circuitry adjustment.

Turning to FIG. 1, a schematic block diagram of functions performed by the present invention are shown. A proximity adjustment means 1 is shown within the dashed lines as comprised of a proximity stimulus response means 3, the output of which is applied to the input of a transducing means 5. The output of transducing means 5 is applied to an optional monitoring means 7 and an optional conversion means 9. It should be understood that response means 3, transducing means 5 and conversion means 9 are all preferably encapsulated with the inaccessible circuiry to be adjusted whereas monitoring means 7, if present, preferably is not encapsulated or inaccessible. A proximity stimulus means 11 is shown separately from adjustment means 1 since it is not physically or electrically connected to it, but functions at a distance from or only in sporadic contact with stimulus response means 3.

Proximity stimulus response means 3 produces a response or output in response to the bringing of stimulus means 11 into the proximity or vicinity of or into physical contact with proximity stimulus means 11. Vicinity, as used here, is a relative term meaning the region surrounding the proximity stimulus response means within which the presence of the proximity stimulus means will cause a response to be produced by the response means. Vicinity encompasses both a distance separation as well as physical contact. The response is converted into an electrical signal, preferably a pulse, by transducing means 5. Transducing means 5 may also include means, such as filtering means, to discriminate between stray or noise responses of response means 3 and responses intentionally induced by stimulus means 11. Transducing means 5 also includes accumulating means for accumulating the output responses of response means 3. Monitoring means 7 provides a means, preferably aural or visual, of monitoring the accumulated number output responses of response means 3. Conversion means 9, if present, permits the conversion of the accumulated number of output responses from digital form to analog form if the circuit to be adjusted requires an analog value to accomplish the adjustment desired.

In FIG. 2, an embodiment of proximity adjustment means 1, monitoring means 7 and conversion means 9 is schematically shown. Element 21 represents a normally open switch having at least one magnetic element which moves in response to the presence of a magnetic field. Switch 21 functions as a proximity stimulus response means which responds to the bringing into its vicinity of a proximity stimulus means in the form of a magnet 23. Preferably, switch 21 is near a surface of any encapsulation so that the magnetic field need not penetrate deeply to close the switch contacts. One form of switch 21, commonly known as a reed switch, is conventionally available, generally sealed within a glass envelope. Bringing a magnet to the vicinity of switch 21 causes its contacts to close; removing the magnet from the vicinity of switch 21 allows its contacts to open. Transducing means 5 of FIG. 1 includes, in the embodiment of FIG. 2, a voltage source $V_1$, a resistor $R_1$, a filtering means comprising a resistor $R_3$ and a capacitor $C_1$, and a conventional digital counter 25. The anode of voltage source $V_1$ is connected to one contact of switch 21 and the first terminals of resistors $R_1$ and $R_3$ are connected to the other contact of switch 21. The cathode of voltage source $V_1$ and the second terminal of resistor $R_1$ are grounded. The second terminal of resistor $R_3$ is connected to the clock input terminal of counter 25 and capacitor $C_1$ is connected from the clock terminal to ground.

When the contacts of switch 21 close in response to the introduction of a magnetic field of the appropriate polarity and strength, voltage source $V_1$ is connected to counter 25 through the filter network. The response to the proximity stimulus means is thus converted into an electrical step voltage signal. The arrival of the step voltage, thus produced, at the clock input of counter 25 causes the binary coded number appearing at its output terminals to be incremented by one. (Counter 25 is assumed throughout this description to be enabled. It is within the scope of the invention to control the ability of counter 25 to count and thereby regulate when circuit adjustment can take place.) That number remains constant at the output of counter 25 when the voltage at the clock terminal drops because switch 21 opens. Thus, counter 25 accumulates a record of the number of times the contacts of switch 21 close. Resistor $R_1$ references the voltage at the clock terminal to ground when switch 21 is open. Resistor $R_3$ and capacitor $C_1$ act as a filter which prevents stray signals or any bouncing of the contacts of switch 21 from causing counter 25 to increment its output in the absence of an intentional proximity stimulus.

The output signal of counter 25 appears at a series of output terminals, each representing a number in binary code, i.e., $2^0, 2^1, 2^2 \ldots$, in a conventional manner. The signals at those output terminals can be used in conventional ways to drive a visual display or provide an aural or other indication of the "count" which appears at the counter's output terminals. In FIG. 2, the output terminals of counter 25 are connected to corresponding input terminals of an optional display decoder 27 which, in turn, is connected to an optional, conventional two digit, seven-segment visual display means 29. As noted below, various types of monitoring means may be used and the display need not have nor be limited to two digits. Display means 29 visually displays in decimal form the "count" or output signal present at the output terminals of counter 25. Each output terminal of counter 25 is connected to one terminal of resistors $R_5$, $R_7$, $R_9$ and $R_{11}$. It is noted that counter 25 is depicted as a four bit counter, but that counters of other bit capacities may be used as will be obvious to one skilled in the art. The opposite terminals of resistors $R_5$, $R_7$, $R_9$ and $R_{11}$ are connected together, that junction being connected to ground through a resistor $R_{13}$. This resistive ladder network comprises an optional conversion means for converting the digital output signal of counter 25 into an analog signal. The values of $R_5$–$R_{11}$ are chosen to have a relationship well known in the art so that they sum the binary output signals of counter 25. The amplitude of the resulting, summed analog signal is proportional to the binary output signal or count of counter 25. That analog signal appears across $R_{13}$ which has a value much smaller than any of the values of resistors $R_5$–$R_{11}$. In order that the signal across $R_{13}$ not be distorted by having a low impedance load connected to it, the common junction of $R_{13}$ and $R_5$–$R_{11}$ is connected to a voltage follower amplifier with gain which comprises part of the conversion means. The voltage follower amplifier includes a differential amplifier 31 having a feedback resistor $R_{15}$ connected between its output and negative sense input terminals. The negative sense input terminal is grounded through a resistor $R_{17}$. The positive sense terminal of amplifier 31 is connected to the common junction of $R_{13}$ and $R_5$–$R_{11}$. The follower amplifier provides a high impedance input for the voltage developed across $R_{13}$ and gain for that signal whih may be necessary depending upon the characteristics of the circuit to be adjusted. It is understood that if the circuit to be adjusted requires a digital signal, the conversion means is omitted, the output signals of counter 25 being directly usable with or without additional amplification.

The embodiment of FIG. 2 can be used with different proximity stimulus response means and correspondingly appropriate proximity stimulus means. For example, in FIG. 3 an embodiment of a stimulus response means comprising a Hall Effect transistor or phototransistor, $Q_1$, shown. With a Hall Effect transistor, a magnet 41 is the appropriate proximity stimulus means; with a phototransistor, a source of electromagnetic energy, such as a light source 43, is the proper proximity stimulus means. It is understood that light source 43, and the other light sources described in this specification, could be an incandescent or luminescent source, could be a solid state diode and need not emit visible light. Its emissions must, however, produce a response in $Q_1$. The collector or drain of $Q_1$ is connected through a biasing resistor $R_{21}$ to the anode of a voltage source $V_2$. The junction of resistor $R_{21}$ and the collector or drain is connected to the clock input terminal of an accumulating means such as counter 25 of FIG. 2. In the absence of a stimulus, the collector-to-base or source-to-drain impedance of $Q_1$ is very high, essentially putting $V_2$ to the clock terminal. Bringing into the vicinity of $Q_1$ the appropriate pole of magnet 41 or the appropriate wavelength of radiant energy from source 43, causes its emitter-to-collector or source-to-drain impedance to decrease, resulting in the application of a low voltage to the clock terminal, incrementing the "count" at the counter's output terminals by one (when the stimulus means is removed (i.e. if positive edge trigger is used). The circuitry of FIG. 3 illustrates an embodiment of the invention in which a normally open switch $Q_1$ which closes upon the proximity of a stimulus means, can be used to accomplish the desired result described in connection with the embodiment of FIG. 2, also for a normally open switch.

In FIG. 4, another embodiment of a proximity stimulus response means is depicted. The response means is a Hall Effect diode or photodiode, $D_1$, the cathode of which is connected to the anode of a voltage source $V_3$. One terminal of a resistor $R_{31}$ is connected to the anode of $D_1$ and to an accumulating means such as the clock terminal of counter 25 of FIG. 2. The other terminal of resistor $R_{31}$ is grounded. The functioning of the embodiment of FIG. 4 is entirely analogous to that of FIG. 2, $D_1$ closing, i.e. becoming conductive, when the appropriate proximity stimulus, e.g. the proper pole of magnet 51 or electromagnetic energy of the appropriate wavelength from source 53, is brought into the vicinity of $D_1$.

As is obvious to one skilled in the art, the transistor of FIG. 3 and the diode of FIG. 4 can be replaced by a photoresistor which, in the case of FIG. 3, switches from a high impedance to a low impedance when struck by electromagnetic energy of the proper wavelength, or which, in the case of FIG. 4, switches from a high impedance to a low impedance when properly illuminated. It is also obvious that when photosensitive devices are used as proximity stimulus response means, any encapsulating material must be at least translucent, and preferably transparent, to the wavelengths of electromagnetic energy which stimulate a response. It is also preferable that a photosensitive device be located near a surface of any encapsulating material to reduce energy transmission losses within the encapsulating material. Where the circuitry is inaccessible, but not encapsulated, the requirement is that the proximity stimulus be able to traverse the minimum separation between the stimulus means and stimulus response means. With any of the embodiments of FIGS. 2–6, there is obviously no potential for contact bounce so that the need for an R-C filter to attenuate stray signals from that origin is eliminated.

Still another embodiment of a proximity stimulus means appears in FIG. 5. There, the anode of a voltage source $V_4$ is connected to a resistor $R_{41}$ and to a Hall Effect resistor or photosensitive resistor $R_{43}$. Resistor $R_{41}$ is grounded through a resistor $R_{45}$, the junction of resistors $R_{41}$ and $R_{45}$ being connected to the negative sense terminal of a differential comparator 61. Resistor $R_{43}$ is grounded through a resistor $R_{47}$, the junction of resistors $R_{43}$ and $R_{47}$ being connected to the positive sense terminal of comparator 61. The voltage at the junction of resistors $R_{43}$ and $R_{47}$, i.e., the voltage at the positive sense input terminal of comparator 61, is designated $V_5$ and that at the negative sense terminal is $V_6$. When the appropriate proximity stimulus is in the vicinity of resistor $R_{43}$, either a magnetic field from a magnet 63, if resistor $R_{43}$ is a Hall Effect resistor, or electromagnetic energy from a light source 65, if resistor $R_{43}$ is a photoresistor, the impedance of $R_{43}$ drops to a low value. When that low impedance is present a larger part of voltage $V_4$ appears across $R_{47}$ in the voltage divider comprised of $R_{43}$ and $R_{47}$. As a result, $V_5$ increases to a value greater than $V_6$, causing the output signal of comparator 61 to go high. The static value of $V_6$ is determined by the relative values of $R_{41}$ and $R_{45}$. The change of the output signal of comparator 61 to its high state is transmitted to an accumulating means, such as counter 25 of FIG. 2, the output signal of which is incremented by one. The removal of the proximity stimulus from the vicinity of the $R_{43}$ causes its impedance to switch to its high state and the output of amplifier 61 to switch to its low state. The values of $R_{41}$, $R_{45}$ and $R_{47}$ are chosen based in part on the high and low impedance values of $R_{43}$ so that $V_6$ will be substantially larger than $V_5$ when $R_{43}$ is in its high impedance state and $V_5$ will be substantially larger than $V_6$ when $R_{43}$ is in its low impedance state.

Figure 6:
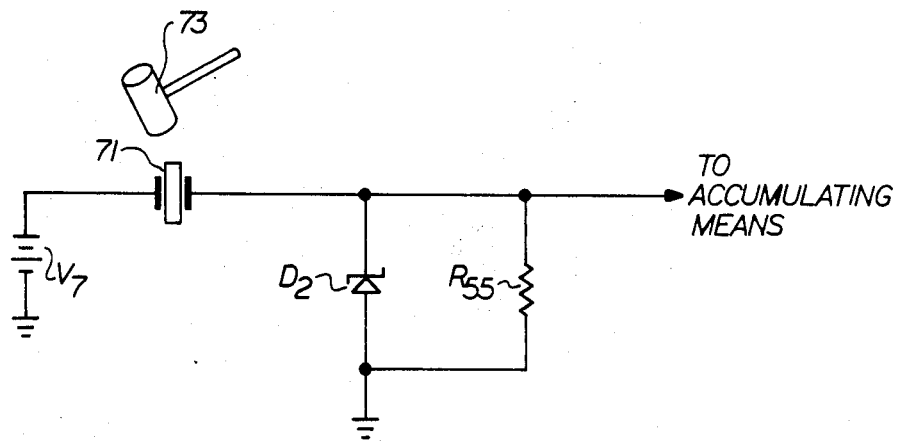
FIG. 6 is a schematic diagram of an alternative embodiment of a proximity stimulus response means according to the invention.

Yet another embodiment of a proximity stimulus response means is shown in FIG. 6. There one contact of a piezoelectric device 71 is connected to the anode of a voltage supply $V_7$ which has its cathode grounded. The other contact of device 71 is connected to the anode of a Zener diode $D_2$ which has its cathode grounded. A resistor $R_{55}$ shunts diode $D_2$. The anode of $D_2$ is connected to an accumulating means such as counter 25 of FIG. 2. Device 71 is a conventional piezoelectric material, preferably a high efficiency titanate bearing ceramic type, which generates electrical signals in response to mechanical shocks. Modern piezoelectric materials can generate relatively large voltage signals. Diode $D_2$ acts to limit the piezoelectric voltages to its breakdown or Zener voltage value at which point it becomes highly conductive. The proximity stimulus means for this embodiment does not work at a distance, but rather requires the delivery of direct, controlled mechanical shocks to device 71. Such a stimulus means is depicted in FIG. 6 as a hammer 73, but it is intended to be equivalent to a mechanism or machine for delivering controlled blows. The voltage generated by device 71 is transmitted to an accumulating means such as counter 25 of FIG. 2. In this embodiment, is important to have the striking surface of device 71 at or near the surface of any encapsulating material both to transmit the forces efficiently to device 71 and to achieve response with the minimum possible force so that no other encapsulated component suffers as a result of the blows. For an inaccessible circuit which is not encapsulated, at least the piezoelectric device must not be inaccessible from the device delivering the blows.

Returning again to FIG. 2, the embodiment of the adjusting means shown provides an analog output voltage which may be used to set some reference electrical level or tune some component in the circuit to which it is attached. (By employing a circuit element having an electrically variable value, e.g. a varactor acting as an electrically tunable capacitor, adjustment of circuit element values is made equivalent to adjusting an electrical value.) For example, in FIG. 6 of my U.S. Pat. No. 4,309,760, a circuit is depicted in which a threshold of release is determined by the setting of a potentiometer $R_9$. What is being established through this potentiometer is a particular voltage level. The embodiment of the invention shown in FIG. 2 could replace potentiometer $R_9$ shown in my earlier patent. The voltage would be adjusted to the desired level by repeatedly bringing magnet 23 into the vicinity of switch 21 and generating pulses until the count, i.e. the output signal of counter 25, reached the desired voltage value. That value would correspond to the desired analog voltage appearing at the output terminal of follower amplifier 31. The detection of the desired voltage level is accomplished through a monitoring means 29. In many applications, particularly where space is limited and cost is to be minimized, it is preferable that the monitoring means be physically separate from the adjusting means. Any encapsulating material can be moulded around an electrical connector, wired to the circuit to be adjusted, via which the monitoring means can be connected when an adjustment is to be made or the adjustable value is to be checked. As noted above, the monitoring means need not incorporate a visual display means, nor need it be digital or of the seven segment type; however, in a ski binding when the release setting should be ever present to provide confidence in system operation, the display means is perpetually present.

If a particular application requires only that an adjustment reach a certain value, a chime or aural signal could signal the person making the adjustment that the proximity stimulus means need not be employed any further. Likewise, a light might flash as a signal. A simplified display of lights might be used, for example, in binary code to display the count. The preceding description is, of course, equally applicable to other embodiments of the invention, including those depicted in FIGS. 3–6, with a substitution of an appropriate proximity stimulus means.

In the embodiment of FIG. 2, counter 25 has been described as an accumulating means for monotonically accumulating the number of stimulus responses, i.e. an up-counter. A two-direction, i.e. up/down counter, accumulating means may also be used with two proximity stimulus response means, one for incrementing or up-counting and one for decrementing or down-counting; the proximity stimulus response means may be of the same type, e.g. reed switch, or of different types, e.g. one reed switch, one photodiode. Where the response means are the same, for example, both reed switches, an incrementing command might be distinguished from a decrementing command by placing the reed switches at opposite physical extremes of an encapsulation. Or differently polarized and normal condition reed switches could be used, so that, for example, the field from a positive magnetic pole would close a normally open switch and the negative magnetic pole would open a normally closed switch. Similar magnetic field stimulus distinctions can be provided for with Hall Effect devices. Multiple phototransistors and photodiodes sensitive to different wavelengths of electromagnetic energy, either inherently or by the use of optical filtering media, can be employed to achieve multiple input functions and/or circuit adjustments. Piezoelectric embodiments may likewise be used multiply, if physically separated from each other since each device requires a relatively sharp direct blow to produce the desired output. Other arrangements of various similar or mixed embodiments of stimulus response means can be used to add functions such as clearing a stored or adjusted value in preparation of a new adjustment or to permit the adjustment of more than one value.

The invention is particularly useful in application to sporting goods which include electronic circuitry having adjustable values. My previously cited patents describe circuitry for use in an electronic safety ski binding and the present invention is applicable to electronic safety ski bindings. In that application, it is desirable that the proximity stimulus means be a separate unit which would be maintained at a central location such as a ski shop or at a ski school, for use in adjusting many skis. Through the use of a monitoring means, ski binding circuitry can be adjusted quickly. Typically, in ski shops and schools, many skis are to be adjusted in a brief period, so that a savings in adjustment time is very important. Although ski bindings undergo many shocks and vibrations during use, the adjustment circuitry embodiments described are relatively immune from those effects. For example, the mass of the reeds in a reed switch is so small that even large impacts will not cause normally open contacts to close and vice-versa. Likewise, piezoelectric devices require a direct sharp blow to produce a voltage so that general shock to an entire encapsulated circuit will generally not cause the generation of an adjusting pulse.

The invention described thus provides a means for adjusting values within encapsulated or otherwise inaccessible circuit without sliding contacts and without physically invading any encapsulation. Various modifications, additions to and substitutions in the invention, and the embodiments described will occur to one of ordinary skill in the art. Accordingly, the scope of the invention is limited solely by the following claims.

I claim:

1. A proximity adjustment means for generating electrical control signals to adjust an electrical value within inaccessible electrical circuitry in response to the presence of a proximity stimulus, said proximity adjustment means comprising:
   proximity stimulus response means for producing an electrical response to the presence of the proximity stimulus within its vicinity,
   isolating means for isolating said proximity stimulus response means from the proximity stimulus, and
   transducing means operatively connected to said proximity stimulus response means, said transducing means including accumulating means for generating digital signals of increasing or decreasing cumulative value corresponding to the electrical responses produced by said proximity stimulus response means to produce said electrical control signals for said proximity adjustment.

2. The invention of claim 1 wherein said accumulating means comprises a digital counter producing digital output signals.

3. The invention of claim 3 further including conversion means for converting the output signals of said digital counter to an analog signal.

4. The invention of claim 1 and further including monitoring means operatively connectable to said accumulating means for monitoring the cumulative value of said digital signals.

5. The invention of claim 5 wherein said monitoring means includes visual display means for visually displaying the cumulative value of said digital signals.

6. The invention of claim 1 wherein said proximity stimulus response means includes a magnetically actuable reed switch.

7. The invention of claim 1 wherein said proximity stimulus response means includes an electromagnetically responsive transistor.

8. The invention of claim 1 wherein said proximity stimulus response means includes an electromagnetically responsive diode.

9. The invention of claim 1 wherein said proximity response means includes a magnetically responsive transistor.

10. The invention of claim 1 wherein said proximity response means includes a magnetically responsive diode.

11. The invention of claim 1 wherein said proximity response means includes a magnetically responsive resistor.

12. The invention of claim 1 wherein said proximity response means includes a piezoelectric device.

13. In sports equipment including inaccessible electrical circuitry, an adjustment means for generating electrical control signals to adjust an electrical value within said circuitry comprising:
   proximity stimulus means for producing an electrical response to the presence of a stimulus within its vicinity,
   isolating means for isolating said proximity stimulus means from the stimulus, and
   transducing means operatively connected to said proximity stimulus response means, said transducing means including accumulating means for generating digital signals of increasing or decreasing cumulative value corresponding to the electrical responses produced by said proximity stimulus response means to produce said electrical control signals for said proximity adjustment.

14. The invention of claim 13 wherein said accumulating means comprises a digital counter producing digital output signals.

15. The invention of claim 14 further including conversion means for converting the output signals of said digital counter to an analog signal.

16. The invention of claim 14 further including monitoring means operatively connectable to said accumulating means for monitoring the cumulative value of said digital signals.

17. The invention of claim 16 wherein the said monitoring means includes visual display means for visually displaying the cumulative value of said digital signals.

18. The invention of claim 14 wherein said proximity stimulus response means includes a magnetically actuable reed switch.

19. The invention of claim 14 wherein said proximity stimulus response means includes an electromagnetically responsive transistor.

20. The invention of claim 14 wherein said proximity stimulus response means includes an electromagnetically responsive diode.

21. The invention of claim 14 wherein said proximity response means includes a magnetically responsive transistor.

22. The invention of claim 14 wherein said proximity response means includes a magnetically responsive diode.

23. The invention of claim 14 wherein said proximity response means includes a magnetically responsive resistor.

24. The invention of claim 14 said proximity response means includes a piezoelectric device.

* * * * *